(12) United States Patent
Mori

(10) Patent No.: US 7,710,306 B2
(45) Date of Patent: May 4, 2010

(54) RAMP GENERATION CIRCUIT AND A/D CONVERTER

(75) Inventor: Akiko Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/937,054

(22) Filed: Nov. 8, 2007

(65) Prior Publication Data

US 2008/0111591 A1    May 15, 2008

(30) Foreign Application Priority Data

Nov. 10, 2006    (JP) .............................. 2006-305505

(51) Int. Cl.
*H03M 1/56*    (2006.01)
(52) U.S. Cl. ...................... 341/169; 341/155
(58) Field of Classification Search ................. 341/144, 341/120, 118; 327/538
See application file for complete search history.

(56) References Cited

U.S. PATENT DOCUMENTS

| | | | | |
|---|---|---|---|---|
| 4,103,223 A * | 7/1978 | Weinert | ....................... | 324/616 |
| 5,504,457 A * | 4/1996 | Jensen | ........................ | 330/129 |
| 5,589,757 A * | 12/1996 | Klang | ........................ | 320/160 |
| 6,040,793 A * | 3/2000 | Ferguson et al. | ............ | 341/143 |
| 6,144,330 A * | 11/2000 | Hoffman et al. | ............ | 341/166 |
| 6,243,034 B1 * | 6/2001 | Regier | ........................ | 341/166 |
| 6,262,632 B1 * | 7/2001 | Corsi et al. | ................. | 330/251 |
| 7,075,470 B2 | 7/2006 | Lee | | |
| 7,251,705 B2 * | 7/2007 | Pasotti et al. | ................ | 711/103 |
| 7,499,556 B2 * | 3/2009 | Kowaki | ...................... | 381/102 |

FOREIGN PATENT DOCUMENTS

| | | |
|---|---|---|
| JP | 04-167623 | 6/1992 |
| JP | 2001-024508 | 1/2001 |
| JP | 2006-081203 | 3/2006 |

\* cited by examiner

*Primary Examiner*—Peguy JeanPierre
(74) *Attorney, Agent, or Firm*—Turocy & Watson, LLP

(57) ABSTRACT

A ramp generation circuit including, a charge supply unit which generates predetermined charges every predetermined time, an integration circuit which accumulates the charges generated from the charge supply unit and converts the charges into a voltage, and, an attenuation unit which outputs, to an output terminal, a voltage obtained by attenuating a noise value of an output voltage from the integration circuit.

19 Claims, 7 Drawing Sheets

Ramp generation circuit 11 (first embodiment)

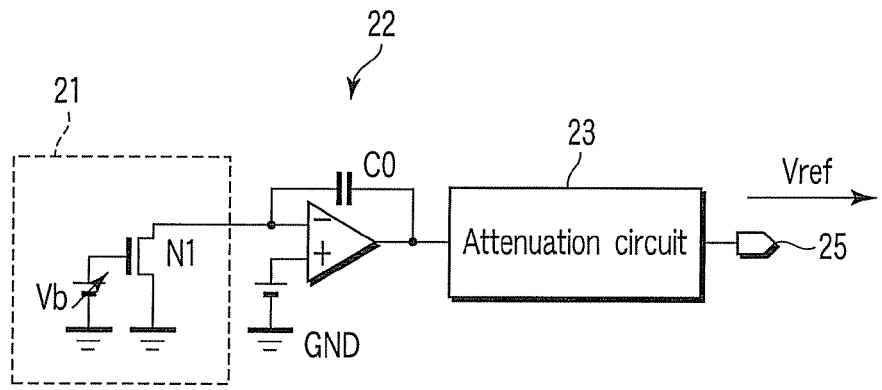
F I G. 6
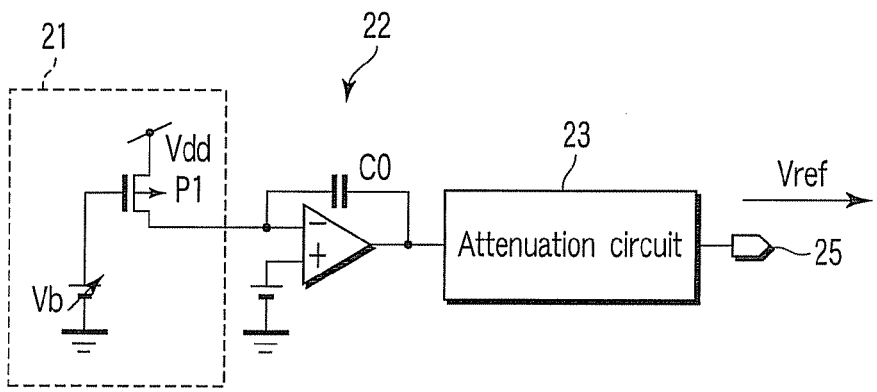
F I G. 7
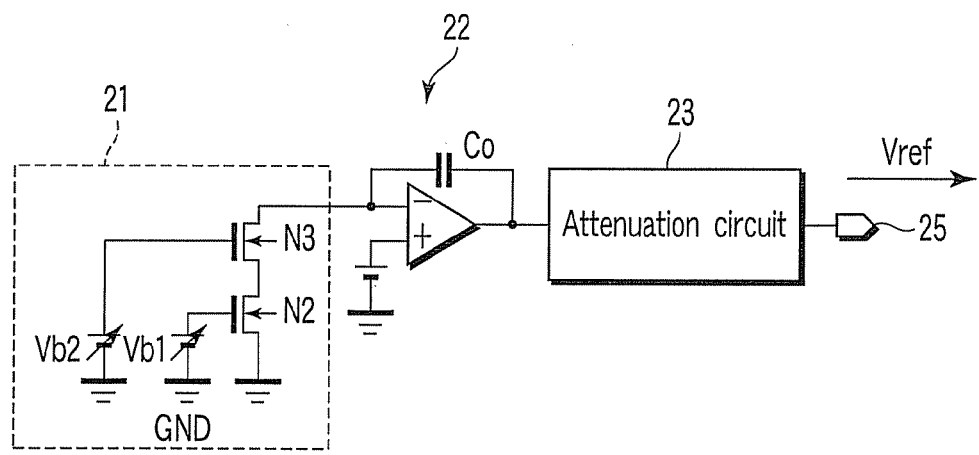
F I G. 8

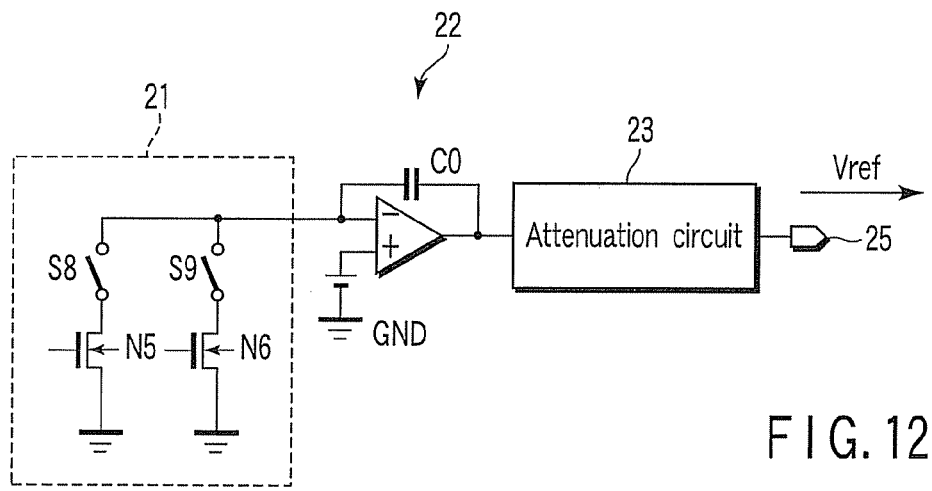
FIG. 12
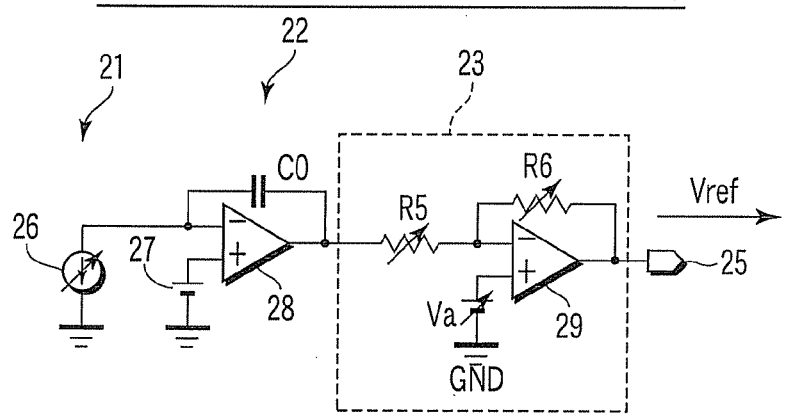
FIG. 13    (−R6/R5)
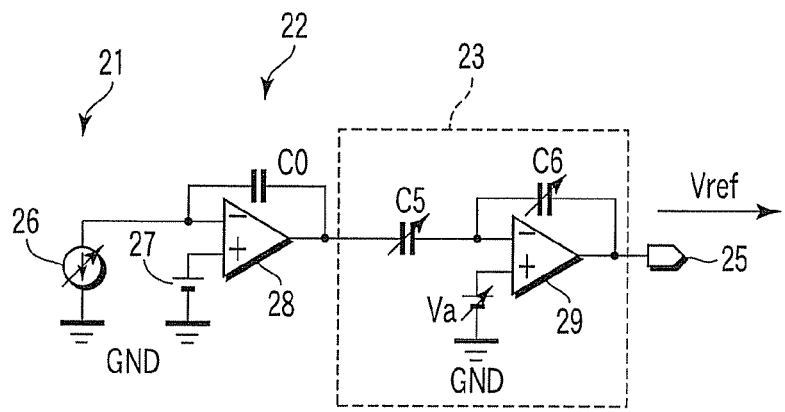
FIG. 14    (−C5/C6)

RAMP GENERATION CIRCUIT AND A/D CONVERTER

CROSS-REFERENCE TO RELATED APPLICATIONS

This application is based upon and claims the benefit of priority from prior Japanese Patent Application No. 2006-305505, filed Nov. 10, 2006, the entire contents of which are incorporated herein by reference.

BACKGROUND OF THE INVENTION

1. Field of the Invention

The present invention relates to a ramp generation circuit and an A/D converter and is more specifically applied to, e.g., an A/D converter when a ramp wave output from a ramp generation circuit has a small slope.

2. Description of the Related Art

There is conventionally an A/D converter having an output circuit and a converter circuit. The output circuit generates an analog signal and outputs it to the converter circuit as a reference signal. The converter circuit receives the reference signal from the output circuit and outputs a desired digital signal (e.g., Jpn. Pat. Appln. KOKAI Publication No. 2006-81203).

However, the reference signal such as a ramp wave output from the output circuit contains all sorts of noise such as noise from peripheral circuits and noise in the output circuit itself. This degrades the S/N ratio (signal-to-noise ratio) of the reference signal. Even when the slope of the ramp wave of the reference signal changes, the magnitude of noise contained in the ramp wave does not change. For this reason, the smaller the slope of the ramp wave becomes, the more conspicuously the S/N ratio degrades.

Consequently, the output error of the converter circuit that receives the reference signal as the input signal grows. Hence, the output error of the A/D converter also becomes large.

As described above, the conventional ramp generation circuit and A/D converter tend to degrade the S/N ratio and increase the output error.

BRIEF SUMMARY OF THE INVENTION

According to an aspect of the present invention, there is provided a ramp generation circuit comprising, a charge supply unit which generates predetermined charges every predetermined time, an integration circuit which accumulates the charges generated from the charge supply unit and converts the charges into a voltage, and an attenuation unit which outputs, to an output terminal, a voltage obtained by attenuating a noise value of an output voltage from the integration circuit.

According to another aspect of the present invention, there is provided an A/D converter comprising, a ramp generation unit including a charge supply unit which generates predetermined charges every predetermined time, an integration circuit which accumulates the charges generated from the charge supply unit and converts the charges into a voltage, and an attenuation unit which outputs, to an output terminal, a voltage obtained by attenuating a noise value of an output voltage from the integration circuit, and a converter unit configured to receive an output voltage from the ramp generation unit as a reference voltage and output a digital signal.

BRIEF DESCRIPTION OF THE SEVERAL VIEWS OF THE DRAWING

FIG. 6 is a circuit diagram showing an example of a charge supply circuit according to the first embodiment;

FIG. 7 is a circuit diagram showing another example of the charge supply circuit according to the first embodiment;

FIG. 8 is a circuit diagram showing still another example of the charge supply circuit according to the first embodiment;

FIG. 12 is a circuit diagram showing still another example of the charge supply circuit according to the first embodiment;

FIG. 13 is a circuit diagram showing a ramp generation circuit according to the second embodiment of the present invention;

FIG. 14 is a circuit diagram showing a ramp generation circuit according to the third embodiment of the present invention;

DETAILED DESCRIPTION OF THE INVENTION

Figure 1:
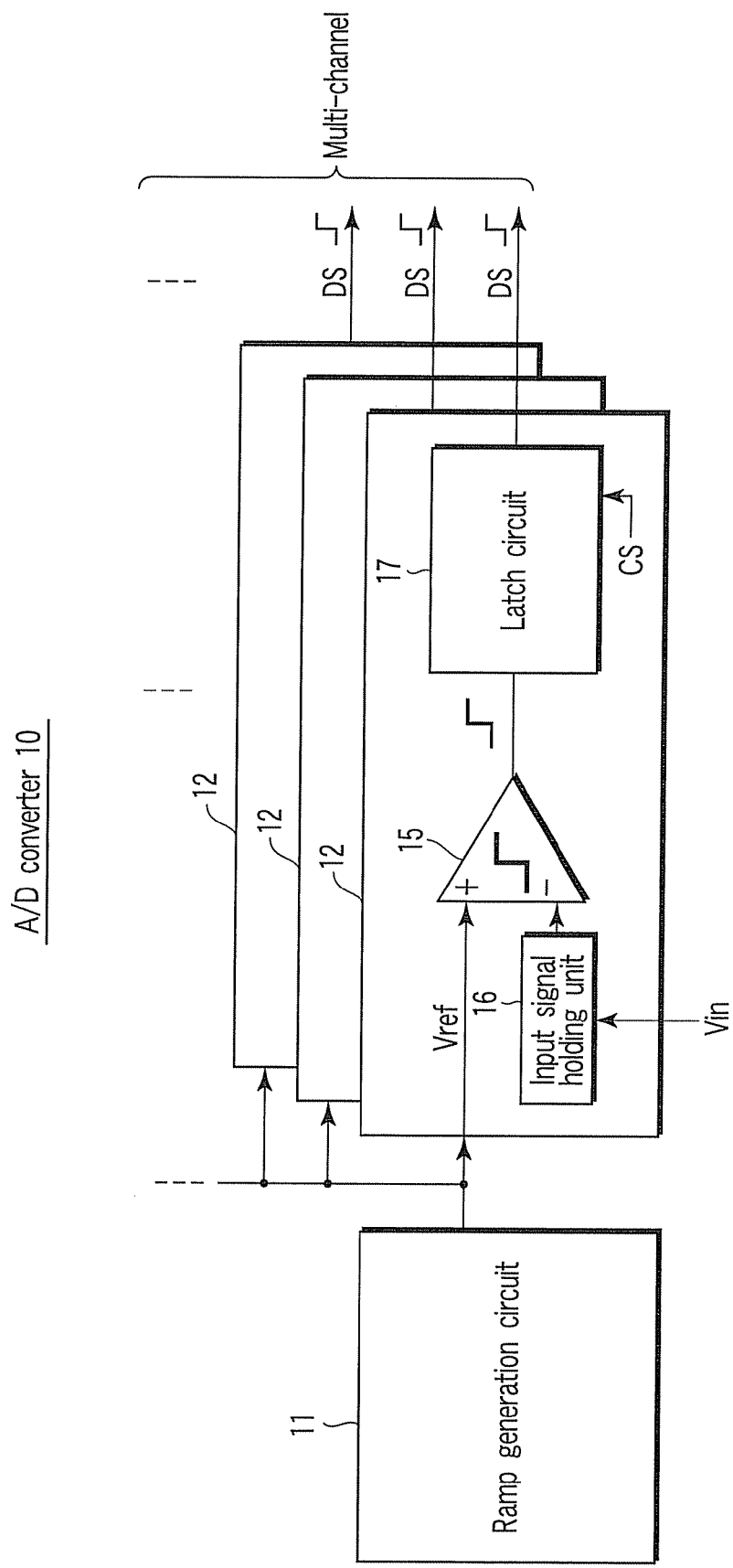
FIG. 1 is a block diagram showing an A/D converter according to the first embodiment of the present invention.

Preferred embodiments of the present invention will be described below with reference to the accompanying drawing. In the following description, the same reference numerals denote the same parts throughout the drawing.

First Embodiment

The basic arrangements of an A/D converter and a ramp generation circuit according to the first embodiment of the present invention will be described with reference to FIGS. 1 to 4.

<1-1. Basic Arrangement of A/D Converter>

FIG. 1 is a block diagram showing an A/D converter according to this embodiment. As shown in FIG. 1, an A/D converter 10 includes a ramp generation circuit 11 which generates a reference signal Vref, and a plurality of converter circuits 12 each of which receives the reference signal Vref and outputs a digital signal DS.

The ramp generation circuit 11 is designed to output the reference signal Vref in synchronism with the timing of a desired counter signal CS.

Each of the converter circuits 12 is designed to commonly receive the reference signal Vref and output the digital signal DS on the basis of the input signal Vin and the reference signal Vref. Each converter circuit 12 includes an input signal holding unit 16, comparison circuit 15, and latch circuit 17. The converter circuits 12 are provided on the order of, e.g., several ten to several thousand pieces per A/D converter 10.

The input signal holding unit 16 is designed to receive an input signal Vin, hold it, and output it to the negative (−) input terminal of the comparison circuit.

The comparison circuit 15 compares the reference signal Vref input to the positive (+) input terminal with the input signal Vin input to the negative (−) input terminal and outputs a digital signal to the latch circuit 17.

The latch circuit 17 is designed to hold the digital signal DS in accordance with the output timing of the digital signal from the comparison circuit 15 and the counter signal CS and then output the digital signal DS.

<1-2. Arrangement of Converter Circuit>

Figure 2:
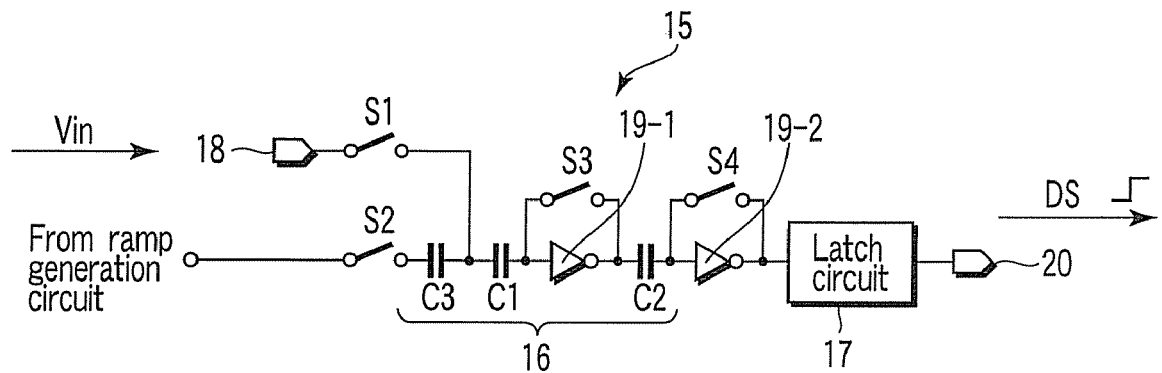
FIG. 2 is a circuit diagram showing a converter circuit according to the first embodiment.

The arrangement of the converter circuit 12 will be described next in detail with reference to FIG. 2. FIG. 2 is a circuit diagram showing the arrangement of the converter circuit 12.

As shown in FIG. 2, the converter circuit 12 includes the comparison circuit (in this case, chopper comparator) 15, input signal holding unit 16, and latch circuit 17.

The comparison circuit (chopper comparator) 15 includes switches S1, S3, and S4, and inverters 19-1 and 19-2.

The switch S1 ON/OFF-controls the input signal Vin in accordance with a control signal. The switch S1 has one terminal connected to an input terminal 18 to receive the input signal Vin, and the other terminal connected to the common node of capacitors C1 and C3.

The switch S3 has one terminal connected to the input of the inverter 19-1, and the other terminal connected to the output of the inverter 19-1.

The switch S4 has one terminal connected to the input of the inverter 19-2, and the other terminal connected to the output of the inverter 19-2.

The inverter 19-1 is designed to invert the input. The inverter 19-1 has an input connected to the other electrode of the capacitor C1, and an output connected to one electrode of a capacitor C2.

The inverter 19-2 is designed to invert the input. The inverter 19-2 has an input connected to the other electrode of the capacitor C2, and an output connected to the input of the latch circuit 17.

The input signal holding unit 16 includes a switch S2, and the capacitors C1, C2, and C3.

The switch S2 ON/OFF-controls the reference signal Vref from the ramp generation circuit 11. The switch S2 has one terminal connected to the output of the ramp generation circuit 11, and the other terminal connected to one electrode of the capacitor C3.

The capacitor C3 holds the reference signal Vref. The other electrode of the capacitor C3 is connected to one electrode of the capacitor C1.

The capacitor C1 holds the input signal. The other electrode of the capacitor C1 is connected to the input of the inverter 19-1.

The capacitor C2 holds the input signal. The capacitor C2 has one electrode connected to the output of the inverter 19-1, and the other electrode connected to the input of the inverter 19-2.

<1-3. Basic Arrangement of Ramp Generation Circuit>

Figure 3:
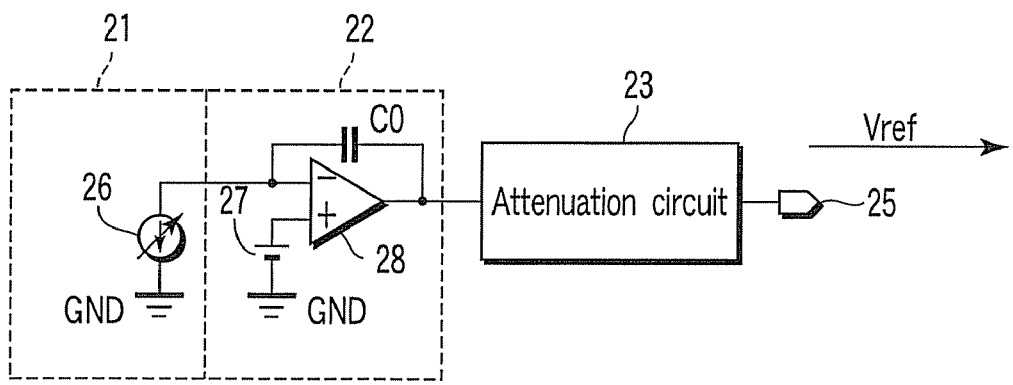
FIG. 3 is a circuit diagram showing a ramp generation circuit (basic arrangement) according to the first embodiment.

The basic arrangement of the ramp generation circuit will be described next with reference to FIG. 3. FIG. 3 is a block diagram showing the basic arrangement of the ramp generation circuit according to this embodiment.

As shown in FIG. 3, the ramp generation circuit 11 includes a charge supply circuit (charge supply unit) 21, integration circuit 22, and attenuation circuit (attenuation unit or attenuator) 23.

The charge supply circuit (charge supply unit) 21 is designed to generate predetermined charges every predetermined time. In this example, the charge supply circuit 21 includes a variable current source 26 with one terminal connected to a ground power supply GND and the other terminal connected to the input of the integration circuit 22. Since the charge supply circuit 21 has the variable current source 26 that is designed to change the current value, a ramp wave (ramp wave 31 to be described later) output from the integration circuit 22 can have a desired slope (slope α33 to be described later) by changing the current value of the variable current source 26.

Note that the arrangement of the charge supply circuit 21 is not limited to this, as will be described later. In this example, one terminal of the variable current source 26 is connected to the ground power supply GND. However, one terminal may be connected to a reference power supply Vdd.

The integration circuit 22 is designed to accumulate the charges generated from the charge supply unit and convert them into a voltage. In this example, the integration circuit 22 includes a capacitor C0, voltage source 27, and operational amplifier 28.

The capacitor C0 is designed to hold the charges output from the charge supply circuit 21. The capacitor C0 has one electrode connected to the output of the charge supply circuit 21, and the other electrode connected to the input of the attenuation circuit 23.

The voltage source 27 has one terminal connected to the ground power supply GND, and the other terminal connected to the positive (+) input terminal of the operational amplifier 28.

The operational amplifier 28 is designed to output, to the attenuation circuit, an output signal (ramp wave 31 to be described later) corresponding to the difference between the signals input to the negative (−) and positive (+) input terminals. The output of the operational amplifier 28 is connected to the input of the attenuation circuit 23.

The attenuation circuit (attenuator) 23 is designed to output, to an output terminal 25, a voltage obtained by attenuating the noise value of the output voltage from the integration circuit 22.

<2. Basic Operation of Ramp Generation Circuit>

Figure 4:
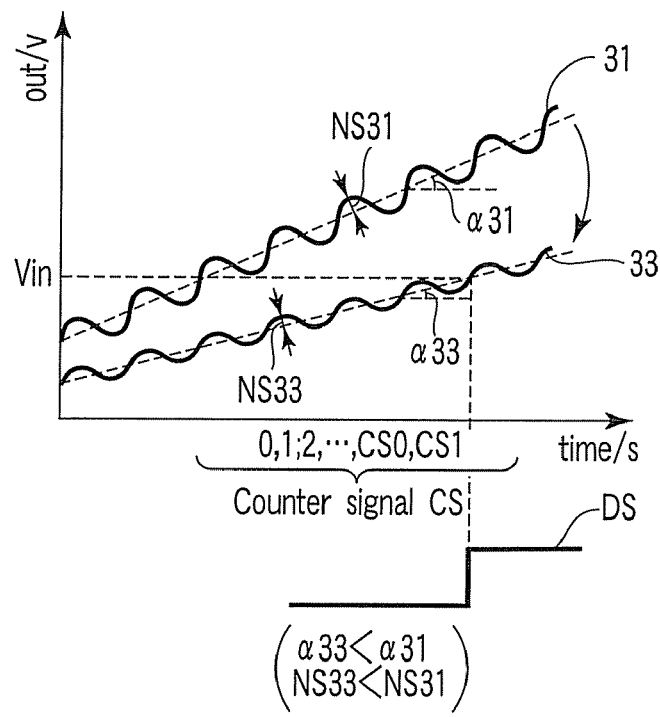
FIG. 4 is a graph showing ramp waves so as to explain the ramp generation circuit according to the first embodiment.

The basic operation of the ramp generation circuit 11 will be described next with reference to FIG. 4. FIG. 4 is a graph showing the relationship between time [time] and the output voltage [V] so as to explain the operation of the ramp generation circuit according to this embodiment.

The charge supply circuit 21 inputs generated charges to the integration circuit 22.

As shown in FIG. 4, the integration circuit 22 outputs the ramp wave 31 corresponding to the received charges to the attenuation circuit 23. At this time, the ramp wave 31 has a slope α31 and noise NS31 including noise from the peripheral circuits and noise in the ramp generation circuit 11 itself.

The attenuation circuit 23 attenuates the noise value and voltage value of the ramp wave 31 and outputs a ramp wave 33 to the output terminal 25 as the reference signal Vref. Hence, noise NS33 contained in the ramp wave 33 is smaller than the noise NS31 (noise: NS33<NS31), and the slope α33 is smaller than the slope α31 (slope: α33<α31).

Since the noise can be reduced, as described above, the S/N ratio (signal-to-noise ratio) [dB] of the reference signal Vref can be higher than when a ramp wave with the same slope (α33) is obtained from the output from the integration circuit 22. The S/N ratio is obtained by dividing the signal level by the noise level.

As a result, it is possible to convert the input signal Vin into the digital signal DS at the timing of the desired counter signal CS on the basis of the reference signal Vref output from the output terminal 25 and output it and reduce the output error of the A/D converter 10.

When the input signal Vin has a narrow range, and the slope of the ramp wave 33 must be made small, degradation in the S/N ratio greatly affects the output error. Even in this case, however, since the attenuation circuit 23 can output the reference signal Vref with a smaller noise value (NS31→NS33), the output error of the A/D converter 10 can be reduced.

<3. Arrangement of Attenuation Circuit>

Figure 5:
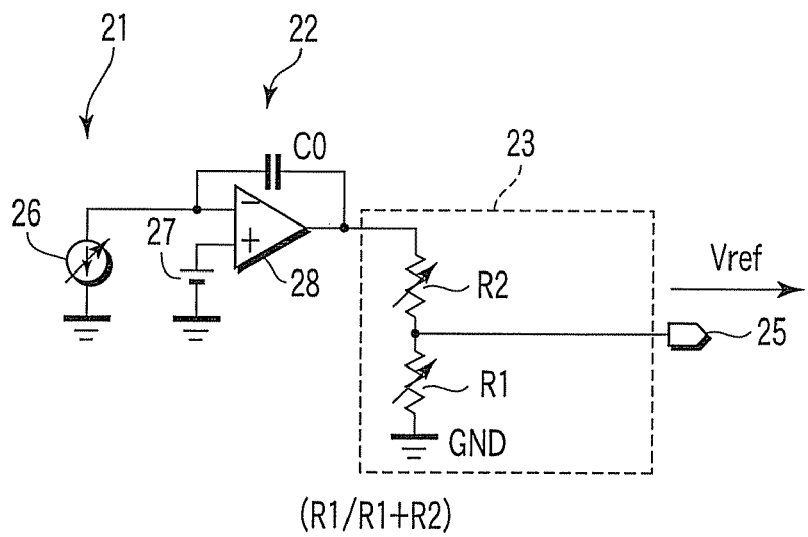
FIG. 5 is a circuit diagram showing the ramp generation circuit according to the first embodiment.

The arrangement of the attenuation circuit according to this embodiment will be described next with reference to FIG. 5. FIG. 5 is a circuit diagram showing the arrangement of the attenuation circuit 23 according to this embodiment.

As shown in FIG. 5, the attenuation circuit 23 includes variable resistors R1 and R2 designed to change the resistance value.

The variable resistor R1 has one terminal connected to the ground power supply GND, and the other terminal connected to the output terminal 25. The variable resistor R2 has one terminal connected to the output terminal 25, and the other terminal connected to the output of the integration circuit 22.

Since the attenuation circuit 23 has the two variable resistors R1 and R2 which are arranged on the output side of the integration circuit 22, it is possible to attenuate the noise value and voltage value of the ramp wave 31 output from the integration circuit 22.

In this arrangement, the attenuation factor of the noise value and voltage value is represented by R1/(R1+R2) where R1 and R2 are the resistance values of the variable resistors R1 and R2. Hence, the value can always be 1 or less. It is also advantageous that the slope of the ramp wave 33 can be selected in accordance with the range of the input signal Vin by combining selection of the resistance values of the variable resistors R1 and R2 and selection of the current value of the variable current source 26 of the charge supply circuit 21.

<4. Effects of the Embodiment>

As described above, the ramp generation circuit 11 and A/D converter 10 according to this embodiment can provide at least effects (1) to (3) to be described below.

(1) It is possible to improve the S/N ratio and reduce the output error.

The ramp generation circuit 11 according to this embodiment has the attenuation circuit (attenuator) 23 that is designed to output, to the output terminal 25, an output voltage obtained by reducing the noise value of the output voltage from the integration circuit 22.

Since the attenuation circuit 23 attenuates the output voltage containing noise components, the ramp wave 33 obtained by decreasing the noise value of the ramp wave 31 output from the integration circuit 22 can be output to the output terminal 25 as the reference signal Vref, as shown in FIG. 4. For this reason, the noise NS33 contained in the ramp wave 33 is smaller than the noise NS31 (noise value: NS33<NS31).

For example, in this arrangement shown in FIG. 5, the attenuation factor is represented by R1/(R1+R2) which can always have a value of 1 or less.

Since the noise of the ramp wave 33 can be made smaller than when a ramp wave with the same slope (α33) is obtained from the output from the integration circuit 22, the S/N ratio (signal-to-noise ratio) of the reference signal Vref can be improved.

As a result, it is possible to convert the input signal Vin into the digital signal DS at the timing of the desired counter signal CS on the basis of the reference signal Vref output from the output terminal 25 and output it and reduce the output error of the A/D converter 10.

It is also possible to select the slope of the ramp wave 33 in accordance with the range of the input signal Vin by combining selection of the resistance values of the variable resistors R1 and R2 and selection of the current value of the variable current source 26 of the charge supply circuit 21.

For this reason, the slope α33 of the ramp generation circuit 11 can be made smaller than the slope α31 of the ramp wave 31 (slope: α33<α31), as shown in, e.g., FIG. 4.

(2) It is possible to reduce the output error even when the wave output from the ramp generation circuit 11 has a small slope.

When the slope of the ramp wave 33 from the ramp generation circuit 11 is small, degradation in the S/N ratio greatly affects the output error. In this example, however, the attenuation circuit 23 can reduce the noise value (NS31→NS33) and output the reference signal Vref even in this case.

It is therefore possible to reduce the output error of the A/D converter 10 even when the wave output from the ramp generation circuit 11 has a small slope.

(3) It is advantageous for a multi-channel scheme.

The A/D converter 10 includes the ramp generation circuit 11 which generates the reference signal Vref, and the plurality of converter circuits 12 each of which receives the reference signal Vref and outputs the digital signal DS. The converter circuits 12 are provided on the order of, e.g., several ten to several thousand pieces per A/D converter 10.

As described above, the reference signal Vref input from the ramp generation circuit 11 of this embodiment to the converter circuit 12 has a smaller noise value and a higher S/N ratio. Since each converter circuit 12 can output the digital signal DS with smaller output error, the arrangement is advantageous for a multi-channel scheme.

It is more advantageous when the arrangement is applied to an A/D converter with many channels, in which the converter circuits 12 are provided on the order of, e.g., several ten to several thousand pieces per A/D converter.

The advantage for the multi-channel scheme is preferably obtained by satisfying the following two conditions.

First, each converter circuit 12 is much smaller than the reference signal Vref generation circuit 11.

Second, all converter circuits 12 can share the reference signal Vref.

<5. Other Arrangements of Charge Supply Circuit 21>

Other arrangements of the charge supply circuit 21 will be described next with reference to FIGS. 6 to 12.

<5-1. Another Arrangement of Charge Supply Circuit 21>

As shown in FIG. 6, the charge supply circuit 21 of this example includes a variable voltage source Vb and an NMOS transistor N1.

The variable voltage source Vb is designed to change the voltage value. The variable voltage source Vb has one terminal connected to the ground power supply GND, and the other terminal connected to the gate of the NMOS transistor N1. The NMOS transistor N1 has a source connected to the ground power supply GND, and a drain connected to the input of the integration circuit 22.

The charge supply circuit 21 of this example is advantageous because it can control the output from the NMOS transistor N1, the slope α31 of the ramp wave 31 output from the integration circuit 22, and the slope α33 of the ramp wave 33 by changing the current value on the basis of the output bias of the variable voltage source Vb.

<5-2. Still Another Arrangement of Charge Supply Circuit 21>

As shown in FIG. 7, the charge supply circuit 21 of this example includes the variable voltage source Vb and a PMOS transistor P1. In this example, the voltage relationship in <5-1.> is reversed.

The variable voltage source Vb is designed to change the voltage value. The variable voltage source Vb has one terminal connected to the ground power supply GND, and the other terminal connected to the gate of the PMOS transistor P1. The PMOS transistor P1 has a source connected to the reference power supply Vdd, and a drain connected to the input of the integration circuit 22.

The charge supply circuit 21 of this example can provide the same effect as in <5-1.>. Additionally, when the voltage relationship is reversed, the charge supply circuit 21 can adopt the arrangement of this example as needed.

<5-3. Still Another Arrangement of Charge Supply Circuit 21>

As shown in FIG. 8, the charge supply circuit 21 of this example includes variable voltage sources Vb1 and Vb2 and NMOS transistors N2 and N3.

The variable voltage source Vb1 is designed to change the voltage value. The variable voltage source Vb1 has one terminal connected to the ground power supply GND, and the other terminal connected to the gate of the NMOS transistor N2. The variable voltage source Vb2 is designed to change the voltage value. The variable voltage source Vb2 has one terminal connected to the ground power supply GND, and the other terminal connected to the gate of the NMOS transistor N3.

The NMOS transistor N2 has a source connected to the ground power supply GND, and a drain connected to the source of the NMOS transistor N3. The drain of the NMOS transistor N3 is connected to the input of the integration circuit 22.

In the charge supply circuit 21 of this example, the NMOS transistors N2 and N3 are so-called cascade-connected. It is therefore effective because the signal from the integration circuit 22 rarely affects the current flowing to the NMOS transistors N2 and N3, and charges can be supplied stably, as compared to <5-1.> and <5-2.>.

At this time, the voltages applied to the gates of the NMOS transistors N2 and N3 preferably have a relationship given by Vb2>Vb1 from the viewpoint of operation. It is possible to change the current value on the basis of the biases Vb1 and Vb2 and control the slope α31 of the ramp wave 31 output from the integration circuit 22 and the slope α33 of the ramp wave 33.

<5-4. Still Another Arrangement of Charge Supply Circuit 21>

Figure 9:
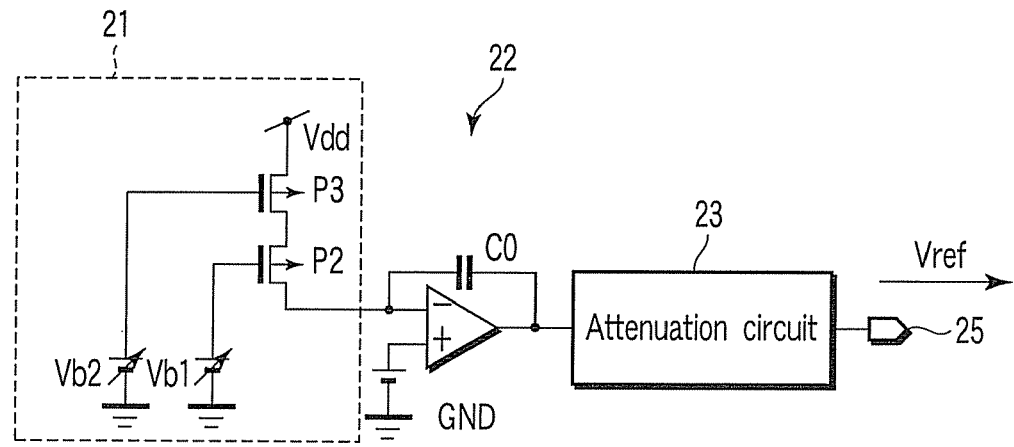
FIG. 9 is a circuit diagram showing still another example of the charge supply circuit according to the first embodiment.

As shown in FIG. 9, the charge supply circuit 21 of this example includes the variable voltage sources Vb1 and Vb2 and PMOS transistors P2 and P3. In this example, the voltage relationship in <5-3.> is reversed.

The variable voltage source Vb1 is designed to change the voltage value. The variable voltage source Vb1 has one terminal connected to the ground power supply GND, and the other terminal connected to the gate of the PMOS transistor P2. The variable voltage source Vb2 is designed to change the voltage value. The variable voltage source Vb2 has one terminal connected to the ground power supply GND, and the other terminal connected to the gate of the PMOS transistor P3.

The PMOS transistor P2 has a source connected to the drain of the PMOS transistor P3, and a drain connected to the input of the integration circuit 22. The source of the PMOS transistor P3 is connected to the reference power supply Vdd.

The charge supply circuit 21 of this example can provide the same effect as in <5-3.>. Additionally, when the voltage relationship is reversed, the charge supply circuit 21 can adopt the arrangement of this example as needed.

<5-5. Still Another Arrangement of Charge Supply Circuit 21>

Figure 10:
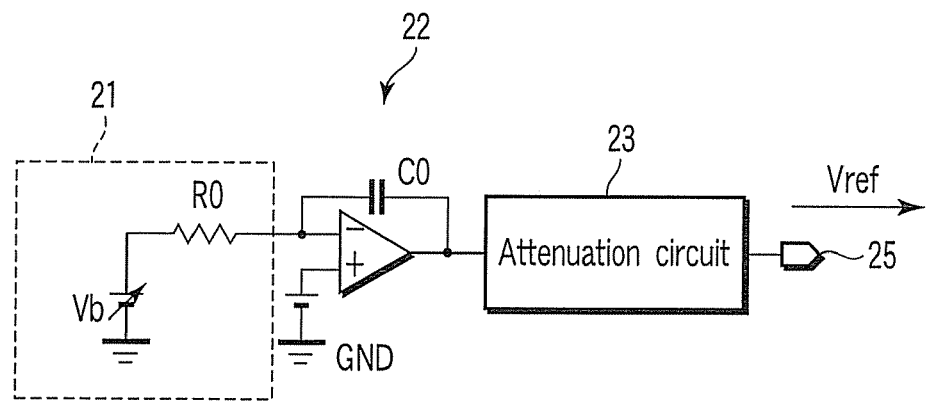
FIG. 10 is a circuit diagram showing still another example of the charge supply circuit according to the first embodiment.

As shown in FIG. 10, the charge supply circuit 21 of this example includes the variable voltage source Vb and a resistor R0.

One terminal of the variable voltage source Vb is connected to the ground power supply GND. The resistor R0 has one terminal connected to the other terminal of the variable voltage source Vb, and the other terminal of the resistor R0 connected to the input of the integration circuit 22.

The arrangement of this example is applicable as needed.

<5-6. Still Another Arrangement of Charge Supply Circuit 21>

Figure 11:
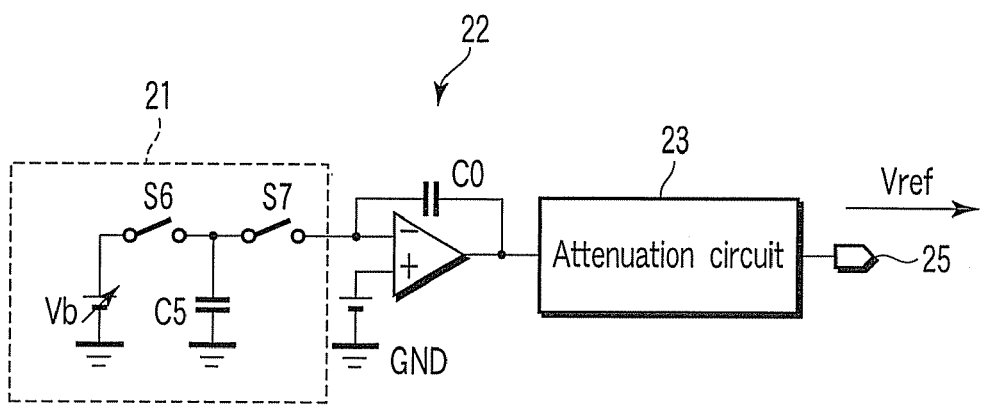
FIG. 11 is a circuit diagram showing still another example of the charge supply circuit according to the first embodiment.

As shown in FIG. 11, the charge supply circuit 21 of this example includes a switched capacitor formed from switches S6 and S7 and a capacitor C5, the variable voltage source Vb.

One terminal of the variable voltage source Vb is connected to the ground power supply GND. The switch S6 has one terminal connected to the other terminal of the variable voltage source Vb, and the other terminal of the switch S6 connected to one terminal of the switch S7. The other terminal of the switch S7 is connected to the input of the integration circuit 22. The capacitor C5 has one electrode connected to the ground power supply GND, and the other electrode connected to one terminal of the switch S7.

The arrangement of this example is applicable as needed.

<5-7. Still Another Arrangement of Charge Supply Circuit 21>

As shown in FIG. 12, the charge supply circuit 21 of this example can adjust the current by using NMOS transistors N5 and N6 and switches S8 and S9.

The NMOS transistor N5 has a source connected to the ground power supply GND, and a drain connected to one terminal of the switch S8. The NMOS transistor N6 has a source connected to the ground power supply GND, and a drain connected to one terminal of the switch S9. The other terminal of each of the switches S8 and S9 is connected to the input of the integration circuit 22.

The arrangement of the charge supply circuit 21 of this example is applicable as needed.

The charge supply circuit 21 having two sets of transistors and switches, i.e., NMOS transistors N5 and N6 and switches S8 and S9 has been exemplified above. However, the present invention is not limited to this and is also applicable to an arrangement having a plurality of sets (N sets) of transistors and switches.

Second Embodiment

Another Arrangement of Attenuation Circuit

A ramp generation circuit and an A/D converter according to the second embodiment will be described next with reference to FIG. 13. This embodiment concerns another arrangement of the attenuation circuit. A detailed description of the same parts as in the first embodiment will not be repeated.

As shown in FIG. 13, an attenuation circuit 23 according to this embodiment includes variable resistors R5 and R6, a variable voltage source Va, and an operational amplifier 29, unlike the first embodiment.

The variable resistor R5 has one terminal connected to the output of an integration circuit 22, and the other terminal connected to the negative (−) input terminal of the operational amplifier 29. The variable resistor R6 has one terminal connected to the other terminal of the variable resistor R5, and the other terminal connected to the output terminal of the operational amplifier 29. The variable voltage source Va has one terminal connected to a ground power supply GND, and the other terminal connected to the positive (+) input terminal of the operational amplifier 29.

The attenuation circuit 23 of this embodiment with the above-described arrangement can output a ramp wave 33 by attenuating a ramp wave 31 output from the integration circuit 22.

The attenuation factor of the noise value and voltage value of the output voltage of the attenuation circuit 23 according to this embodiment is represented by −R6/R5. In this example, the attenuation factor is negative. Since the phase of the input is opposite to that of the output, an output in a phase opposite to a desired ramp wave needs to be obtained from the integration circuit 22.

As described above, the ramp generation circuit and A/D converter according to this embodiment can provide the same effects as the above-described (1) to (3).

The attenuation circuit 23 according to this embodiment has the variable resistors R5 and R6 and the variable voltage source Va.

The attenuation circuit 23 is advantageous because is can change a slope α33 of the ramp wave 33 in accordance with the input range by selecting the resistance values of the variable resistors R5 and R6 and the voltage value of the variable voltage source Va in combination with a variable current source 26 of the preceding stage. When the resistance values of the variable resistors R5 and R6 are selected such that −R6/R5 becomes smaller than −1, the slope α33 of the ramp wave 33 can be amplified (not attenuated) as compared to a slope α31 of the ramp wave 31 output from the integration circuit 22.

Third Embodiment

Still Another Arrangement of Attenuation Circuit

A ramp generation circuit and an A/D converter according to the third embodiment will be described next with reference to FIG. 14. This embodiment concerns still another arrangement of the attenuation circuit. A detailed description of the same parts as in the first embodiment will not be repeated.

As shown in FIG. 14, an attenuation circuit 23 according to this embodiment includes variable capacitors C5 and C6, a variable voltage source Va, and an operational amplifier 29, unlike the first embodiment.

The variable capacitor C5 has one electrode connected to the output of an integration circuit 22, and the other electrode connected to the negative (−) input terminal of the operational amplifier 29. The variable capacitor C6 has one electrode connected to the other electrode of the variable capacitor C5, and the other electrode connected to the output terminal of the operational amplifier 29. The variable voltage source Va has one terminal connected to a ground power supply GND, and the other terminal connected to the positive (+) input terminal of the operational amplifier 29.

The attenuation circuit 23 of this embodiment with the above-described arrangement can output a ramp wave 33 by attenuating a ramp wave 31 output from the integration circuit 22.

The attenuation factor of the attenuation circuit 23 according to this embodiment is represented by −C5/C6. In this example, the attenuation factor is negative. Since the phase of the input is opposite to that of the output, an output in a phase opposite to a desired ramp wave needs to be obtained from the integration circuit 22.

As described above, the ramp generation circuit and A/D converter according to this embodiment can provide the same effects as the above-described (1) to (3).

The attenuation circuit 23 according to this embodiment has the variable capacitors C5 and C6 and the variable voltage source Va.

The attenuation circuit 23 is advantageous because is can change a slope α33 of the ramp wave 33 in accordance with the input range by selecting the capacitance values of the variable capacitors C5 and C6 and the voltage value of the variable voltage source Va in combination with a variable current source 26 of the preceding stage. When the capacitance values of the variable capacitors C5 and C6 are selected such that −C5/C6 becomes smaller than −1, the slope α33 of the ramp wave 33 can be amplified (not attenuated) as compared to a slope α31 of the ramp wave 31 output from the integration circuit 22.

COMPARATIVE EXAMPLES

Without Attenuation Circuit

Figure 15:
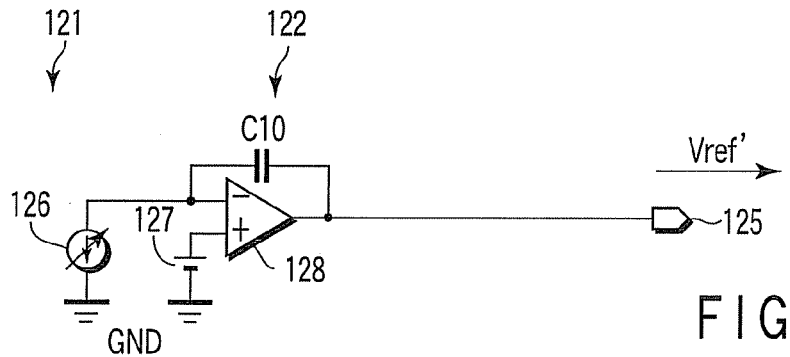
FIG. 15 is a circuit diagram showing a ramp generation circuit of a comparative example.
Figure 16:
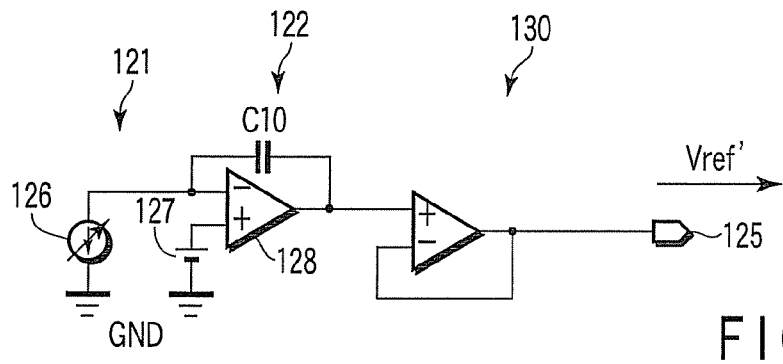
FIG. 16 is a circuit diagram showing a ramp generation circuit of another comparative example.

Ramp generation circuits of comparative examples will be described next with reference to FIGS. 15 to 17 and compared with the ramp generation circuits and A/D converters of the first to third embodiments. FIGS. 15 and 16 are circuit diagrams showing the arrangements of the ramp generation circuits of the comparative examples. A detailed description of the same parts as in the first embodiment will not be repeated.

<Arrangement>

As shown in FIGS. 15 and 16, ramp generation circuits 111 of both comparative examples have, on their final stage, an integration circuit 122 or voltage follower circuit 130 but no attenuation circuit 23, unlike the first embodiment.

For this reason, the ramp generation circuit 111 outputs, as a reference signal Vref', a ramp wave containing all sorts of noise such as noise from the circuit of the preceding stage or peripheral digital circuits and noise in the circuit 111 itself, unlike the first embodiment.

<Operation of Ramp Generation Circuit 111>

The operation of the ramp generation circuit 111 according to each comparative example will be described next with reference to FIG. 17. FIG. 17 is a graph showing the operation waveform of the ramp generation circuit 111 according to each comparative example and the relationship between time [time] and the output voltage [V].

Figure 17:
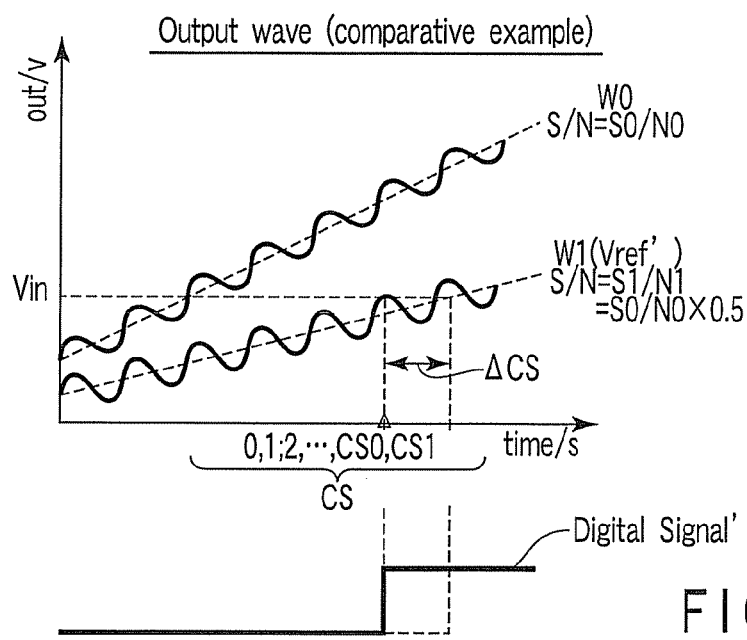
FIG. 17 is a graph showing the ramp waves of the ramp generation circuit of the comparative example.

As shown in FIG. 17, the ramp wave output from an output terminal 125 as the reference signal Vref' is represented by a wave W0 or a wave W1. The wave W0 is a ramp wave when the slope is large. The wave W1 is a ramp wave when the slope is small.

In the comparative examples, since no attenuation circuit 23 is provided, both the waves W0 and W1 are output as the reference signal Vref' without attenuating noise.

For example, let S0 be the signal value of the wave W0, N0 be the magnitude of the noise value of the wave W0, S1 be the signal value of the wave W1, and N1 be the magnitude of the noise value of the wave W1 (noise value: N0=N1, signal value: S1=S0×0.5). In this case, the S/N ratio of the wave W0 is S0/N0. On the other hand, the S/N ratio of the wave W1 is S1/N1=S0/N0×0.5. Hence, the S/N ratio of the wave W1 degrades by about 50% as compared to that of the wave W0.

As described above, even when the slope of the ramp wave changes, the magnitude of noise does not change (noise value: N0=N1). As is apparent from this, the smaller the slope of the ramp wave becomes, the more the S/N ratio degrades.

For this reason, for example, input signal Vin is transformed into a digital signal DS' having an output error ΔCS, according to at the timing of a counter signal CS0 earlier than a desired counter signal CS1, bases of the reference signal Vref' output from the output terminal 125 in correspondence with the ramp wave W1, and outputted, as shown in FIG. 17.

As a result, when the wave has a small slope (W1), the influence of degradation in the S/N ratio increases, and the output error of the A/D converter grows.

In the above examples, one terminal of the (variable) voltage source or (variable) current source is connected to the ground power supply GND. However, the present invention is not limited to this and is also applicable as long as one terminal of a (variable) voltage source or (variable) current source is connected to a fixed power supply. Hence, it is also possible to connect the reference power supply Vdd to one terminal of the (variable) voltage source or (variable) current source, which is connected to the ground power supply GND.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ramp generation circuit comprising:
    a charge supply unit which generates predetermined charges every predetermined time;
    an integration circuit which accumulates the charges generated from the charge supply unit and converts the charges into a voltage; and
    an attenuation unit which outputs, to an output terminal, a voltage obtained by attenuating a noise value of an output voltage from the integration circuit, the attenuation unit can change one of an attenuation factor of the output voltage and a voltage value of the output voltage, and the attenuation unit comprises a variable voltage source whose one terminal is connected to a power supply.

2. The circuit according to claim 1, wherein the attenuation unit further comprises:
    a first variable resistor whose one terminal is connected to an output of the integration circuit;
    a comparison unit whose first input is connected to the other terminal of the variable voltage source, whose second input is connected to the other terminal of the first variable resistor, and whose output is connected to the output terminal; and
    a second variable resistor whose one terminal is connected to the other terminal of the first variable resistor, and whose other terminal is connected to the output terminal.

3. The circuit according to claim 1, wherein the charge supply unit comprises:
    a first switch whose one terminal is connected to the other terminal of the variable voltage source;
    a second switch whose one terminal is connected to the other terminal of the first switch, and whose other terminal is connected to an input of the integration circuit; and
    a capacitor whose one electrode is connected to the power supply, and whose other electrode is connected to the one terminal of the second switch.

4. The circuit according to claim 1, wherein the attenuation unit comprises:
    a first variable resistor whose one terminal is connected to an output of the integration circuit;
    an operational amplifier whose negative input terminal is connected to the other terminal of the first variable resistor; and
    a second variable resistor whose one terminal is connected to the other terminal of the first variable resistor, and whose other terminal is connected to an output terminal of the operational amplifier;
    the variable voltage source whose one terminal is connected to a power supply, and whose other terminal is connected to a positive input terminal of the operational amplifier.

5. The circuit according to claim 1, wherein the attenuation unit comprises:
    a first variable capacitor whose one terminal is connected to an output of the integration circuit;
    an operational amplifier whose negative input terminal is connected to the other terminal of the first variable capacitor; and
    a second variable capacitor whose one terminal is connected to the other terminal of the first variable capacitor, and whose other terminal is connected to an output terminal of the operational amplifier;
    the variable voltage source whose one terminal is connected to a power supply, and whose other terminal is connected to a positive input terminal of the operational amplifier.

6. The circuit according to claim 1, wherein the charge supply unit comprises:
    a transistor whose control terminal is connected to the other terminal of the variable voltage source, and whose current path has one end connected to the power supply and the other end connected to an input of the integration circuit.

7. The circuit according to claim 1, wherein the charge supply unit comprises:
    a first variable voltage source whose one terminal is connected to a power supply;
    a first transistor whose control terminal is connected to the other terminal of the first variable voltage source, and whose current path has one end connected to an input of the integration circuit;
    a second variable voltage source whose one terminal is connected to the power supply; and
    a second transistor whose control terminal is connected to the other terminal of the second variable voltage source, and whose current path has one end connected to the power supply and the other end connected to the other end of the current path of the first transistor.

8. The circuit according to claim 1, wherein the charge supply unit comprises:
   a resistor whose one terminal is connected to the other terminal of the variable voltage source, and whose other terminal is connected to an input of the integration circuit.

9. The circuit according to claim 1, wherein the charge supply unit comprises:
   a first transistor whose current path has one end connected to a power supply;
   a first switch whose one terminal is connected to the other end of the current path of the first transistor, and whose other terminal is connected to an input of the integration circuit;
   a second transistor whose current path has one end connected to the power supply; and
   a second switch whose one terminal is connected to the other end of the current path of the second transistor, and whose other terminal is connected to the input of the integration circuit.

10. An A/D converter comprising:
    a ramp generation unit including a charge supply unit which generates predetermined charges every predetermined time, an integration circuit which accumulates the charges generated from the charge supply unit and converts the charges into a voltage, and an attenuation unit which outputs, to an output terminal, a voltage obtained by attenuating a noise value of an output voltage from the integration circuit; and
    a converter unit configured to receive an output voltage from the ramp generation unit as a reference voltage and output a digital signal, the converter unit comprising a comparison unit which outputs the digital signal, the comparison unit having a negative input terminal connected to the input signal holding unit and a positive input terminal that receives the reference voltage.

11. The A/D converter according to claim 10, further comprising a plurality of converter units whose inputs are commonly connected to an output of the ramp generation unit.

12. The A/D converter according to claim 10, wherein the converter unit comprises:
    an input signal holding unit which has an input connected to an input signal and holds and outputs the input signal; and
    a latch unit which has an input connected to the digital signal, and hold and outputs the digital signal according to at a outputting timing of the digital signal and a counter signal.

13. The A/D converter according to claim 12, wherein the comparison unit comprises a chopper comparator.

14. The A/D converter according to claim 10, wherein the input signal holding unit comprises:
    a first switch whose one terminal is connected to an input terminal to receive the input signal;
    a first capacitor whose one electrode is connected to the other terminal of the first switch;
    a second switch whose one terminal is connected to the other electrode of the first capacitor;
    a second capacitor whose one electrode is connected to the other terminal of the second switch;
    a third switch whose one terminal is connected to the other electrode of the second capacitor; and
    a third capacitor whose one electrode is connected to the one electrode of the first capacitor, the other electrode is electrically connected to the ramp generation circuit.

15. The A/D converter according to claim 10, wherein the attenuation unit can change one of an attenuation factor of the output voltage and a voltage value of the output voltage.

16. The A/D converter according to claim 10, wherein the attenuation unit comprises:
    a variable voltage source whose one terminal is connected to a power supply;
    a first variable resistor whose one terminal is connected to an output of the integration circuit;
    a comparison unit whose first input is connected to the other terminal of the variable voltage source, whose second input is connected to the other terminal of the first variable resistor, and whose output is connected to the output terminal; and
    a second variable resistor whose one terminal is connected to the other terminal of the first variable resistor, and whose other terminal is connected to the output terminal.

17. The A/D converter according to claim 10, wherein the charge supply unit comprises:
    a variable voltage source whose one terminal is connected to a power supply;
    a first switch whose one terminal is connected to the other terminal of the variable voltage source;
    a second switch whose one terminal is connected to the other terminal of the first switch, and whose other terminal is connected to an input of the integration circuit; and
    a capacitor whose one electrode is connected to the power supply, and whose other electrode is connected to the one terminal of the second switch.

18. The A/D converter according to claim 10, wherein the attenuation unit comprises:
    a first variable resistor whose one terminal is connected to an output of the integration circuit;
    an operational amplifier whose negative input terminal is connected to the other terminal of the first variable resistor;
    a second variable resistor whose one terminal is connected to the other terminal of the first variable resistor, and whose other terminal is connected to an output terminal of the operational amplifier; and
    a variable voltage source whose one terminal is connected to a power supply, and whose other terminal is connected to a positive input terminal of the operational amplifier.

19. The A/D converter according to claim 10, wherein the attenuation unit comprises:
    a first variable capacitor whose one terminal is connected to an output of the integration circuit;
    an operational amplifier whose negative input terminal is connected to the other terminal of the first variable capacitor;
    a second variable capacitor whose one terminal is connected to the other terminal of the first variable capacitor, and whose other terminal is connected to an output terminal of the operational amplifier; and
    a variable voltage source whose one terminal is connected to a power supply, and whose other terminal is connected to a positive input terminal of the operational amplifier.

* * * * *